US 7,986,569 B2

(12) United States Patent
Song

(10) Patent No.: US 7,986,569 B2
(45) Date of Patent: Jul. 26, 2011

(54) SEMICONDUCTOR DEVICE

(75) Inventor: Yun Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 127 days.

(21) Appl. No.: 12/345,323

(22) Filed: Dec. 29, 2008

(65) Prior Publication Data

US 2010/0110801 A1 May 6, 2010

(30) Foreign Application Priority Data

Nov. 6, 2008 (KR) .................. 10-2008-0110038

(51) Int. Cl.
*G11C 7/00* (2006.01)
(52) U.S. Cl. .............. 365/189.11; 365/226; 365/230.06; 365/230.08; 365/191
(58) Field of Classification Search ............ 365/189.11, 365/189.09, 230.06, 189.05, 226, 230.08
See application file for complete search history.

(56) References Cited

U.S. PATENT DOCUMENTS

2006/0221717 A1* 10/2006 Lee .................. 365/189.04
2006/0238215 A1* 10/2006 Kim et al. ............. 326/1
2008/0165594 A1* 7/2008 Kim ................. 365/189.11

FOREIGN PATENT DOCUMENTS

KR 1020050096064 A 10/2005

OTHER PUBLICATIONS

Notice of Preliminary Rejection issued from Korean Intellectual Property Office on Apr. 9, 2010.

* cited by examiner

*Primary Examiner* — Pho M Luu
*Assistant Examiner* — Tha-O Bui
(74) *Attorney, Agent, or Firm* — IP & T Group LLP

(57) ABSTRACT

A semiconductor device includes a termination driver for driving a data line with a predetermined termination level by using an external power supply voltage and a drive current controller for controlling a drive current flowing into the data line from the termination driver in response to a voltage level of the external power supply voltage.

8 Claims, 3 Drawing Sheets

SEMICONDUCTOR DEVICE

CROSS-REFERENCE TO RELATED APPLICATIONS

The present invention claims priority of Korean patent application number 10-2008-0110038, filed on Nov. 6, 2008, which is incorporated by reference in its entirety.

BACKGROUND OF THE INVENTION

The present invention relates to a semiconductor design technology, and more particularly, to a termination circuit.

Recent research trend is to develop a semiconductor memory device, including Double Data Rate Synchronous DRAM DDR SDRAM with a large storage capacity. Hence, the number of memory cells for storing data has been greatly increased. The increase in the number of the memory cells may also lead to an increase in chip size, and also to an increase in the number of lines conveying signals inside the semiconductor memory device. For example, a semiconductor memory device of 512 MB may include four memory banks, each of which includes a plurality of memory cells, and a semiconductor memory device of 1 GB may include eight memory banks. In other words, the increase in the memory banks is also accompanied by a larger and longer number of data lines carrying data and larger load on the data lines.

Meanwhile, data lines provided in a semiconductor memory device are classified into a segment input/output line, a local input/output line, and a Global Input/Output GIO line depending on positions where they are. Among these lines, the GIO line may cause data distortion and loss because it has a relatively larger loading than that of the segment input/output line or the local input/output line.

To resolve this problem, a repeater system is typically used to reduce data distortion by inserting two stages of inverters approximately in the middle of the GIO line. However, this repeater system is nothing but an enhanced driver in its structure, and thus results in large current consumption since the number of transistors used therein and the size of driver are large. In order to mitigate the deficiency, a termination system for GIO line has been proposed.

Hereinafter, a termination system will be briefly described. According to a typical termination system, a GIO line is pre-charged to a termination voltage level, e.g., a ½ voltage level of an external power supply voltage prior to loading data on the GIO line and, even during a period when data is applied, this termination operation is continuously performed, thereby reducing a variation in voltage level of data transferred onto the GIO line, that is, a swing width of data. As a result, since the data being transferred through the GIO line has a small swing width, current consumption caused by data transfer can be reduced and data can be transferred more quickly.

FIG. 1 is a circuit diagram illustrating a termination operation of a conventional semiconductor memory device.

As shown, the conventional memory device includes a termination driver 110 and a latch unit 130.

The termination driver 110 drives a GIO line with a termination level in response to a termination enable signal EN_TERM, and the latch unit 130 latches data being applied to the GIO line in response to the termination enable signal EN_TERM.

Here, the termination enable signal EN_TERM is activated during a read operation of the semiconductor memory device and inactivated during a write operation thereof. That is, during the read operation, the termination driver 110 performs a termination operation on the GIO line, while the latch unit 130 latches data applied to the GIO line during the write operation.

The following is a detailed description about a termination operation of a termination circuit.

When a termination operation of the termination driver 110 is to be performed during a read operation, the GIO line is pre-charged to a termination level and data being applied thereto is transferred with a swing width caused by a termination operation. Herein, since a current accompanying the data transferred to the GIO line may be opposed by a drive current being transferred from the termination driver 110 to the GIO line, the data may not have a full swing width but has a small swing width.

Subsequently, the termination operation of the termination driver 110 is disabled during a write operation, and the latch unit 130 is enabled to latch the data being applied to the GIO line.

In general, the termination circuit has to properly control a drive current in its termination operation, and thus, its design needs to be made carefully. If the drive current is excessively large, a transfer speed of data being transferred to the GIO line may be faster but data loss and current consumption may be larger. On the other hand, if a drive current is excessively small, current consumption may be reduced but a transfer speed of data may be slower and coupling may occur between adjacent GIO lines.

Particularly, the transfer speed of data becomes a very critical factor in operation of a receiver (not shown) which is connected to the GIO line and receives data being transferred through the GIO line. The receiver should receive data at a specific time because the margin between the received data and the specific time depending on the transfer speed of data may be different. Consequently, if the transfer speed of data is excessively faster or slower than a target speed, a margin failure in the operation may occur.

Meanwhile, the semiconductor memory device performs diverse operations by using an external power supply voltage and a ground voltage applied thereto. Here, the external power supply voltage may have a different level depending on products. Similarly, the termination circuit also carries out a termination operation by utilizing the external power supply voltage and the ground voltage inputted thereto. As noted above, the external power supply voltage applied to the termination circuit may depend on products. Consequently, the drive current used for the termination operation may vary corresponding to the external power supply voltage, and thus the transfer speed of data may also vary. As described above, this causes margin failure when the data being transferred through the GIO line is received by the receiver.

SUMMARY OF THE INVENTION

An exemplary embodiment of the present invention is directed to providing a semiconductor memory device, which can control a drive current flowing into a GIO line depending on a voltage level of an external power supply voltage.

Another exemplary embodiment of the present invention is directed to providing a method for performing a termination operation of a semiconductor memory device, which can allow a drive current flowing into a GIO line to be kept constant, regardless of a voltage level of an external power supply voltage being applied to a termination circuit.

In accordance with an aspect of the invention, a semiconductor memory device comprises a termination driver for driving a data line with a predetermined termination level by using an external power supply voltage and a drive current controller for controlling a drive current flowing into the data line from the termination driver in response to a voltage level of the external power supply voltage.

In accordance with other aspect of the invention a semiconductor memory device comprises a termination driver for driving a data line with a predetermined termination level by using an external power supply voltage and a load multiplexer for selectively multiplexing loads of a drive current path of the termination driver in response to a voltage level of the external power supply voltage.

The present invention can control a drive current flowing into a GIO line depending on an external power supply voltage so that a constant drive current always flows into the GIO line. Thus, a semiconductor memory device in accordance with present invention may keep a constant data transfer speed regardless of the external power supply voltage to minimize coupling between adjacent GIO lines. In addition, the semiconductor memory device of the present invention can secure a sufficient margin (for example, a time span) between data being transferred through a GIO line and its reception operation by a receiver.

DESCRIPTION OF SPECIFIC EMBODIMENTS

Hereinafter, specific embodiments of the present invention will be described in detail with reference to the accompanying drawings so that the present invention can easily be practiced by those skilled in the art to which the invention pertains.

Figure 2:
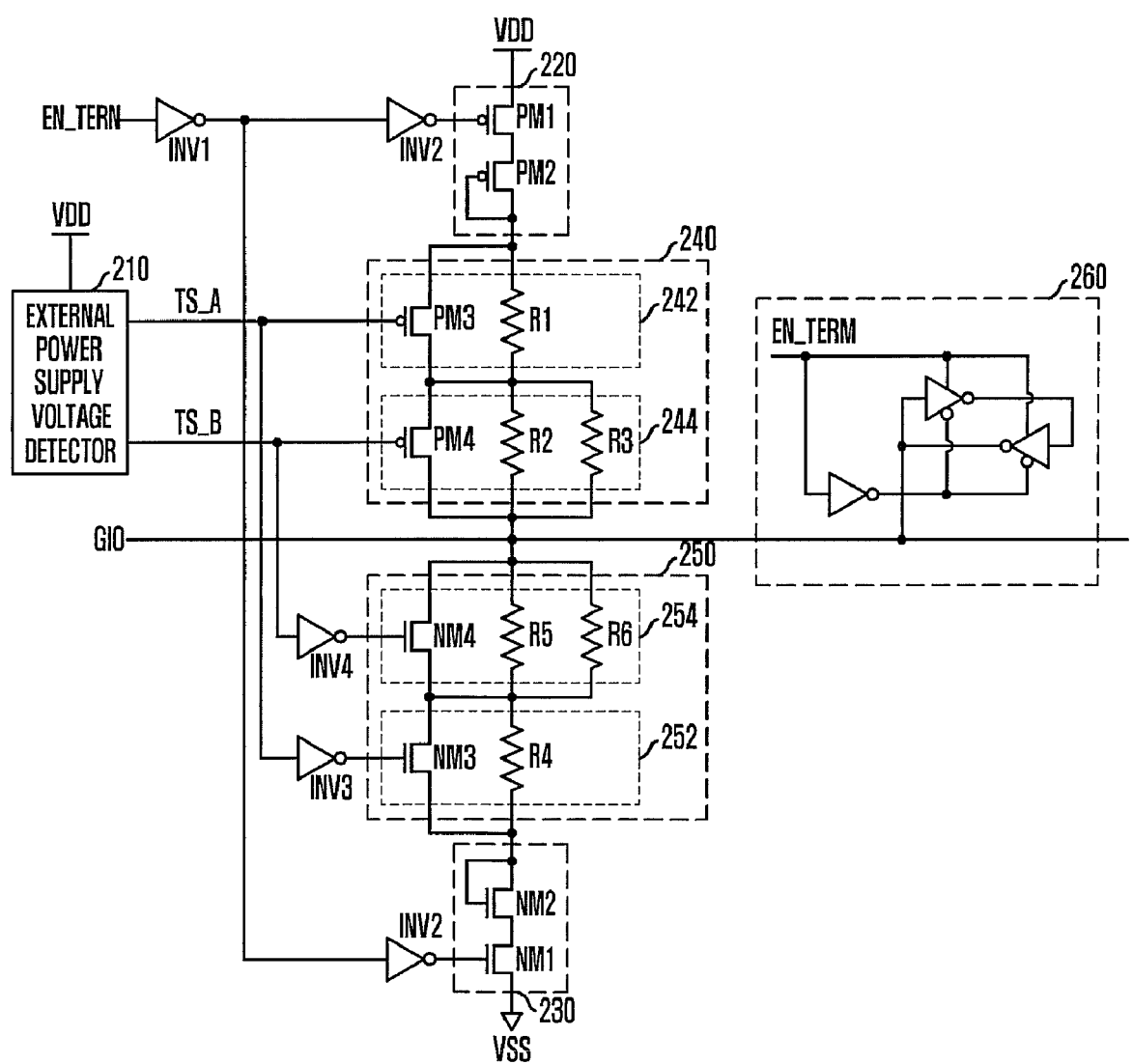
FIG. 2 is a circuit diagram illustrating a termination operation of a semiconductor memory device in accordance with a first embodiment of the present invention.

FIG. 2 a circuit diagram illustrating a termination operation of a semiconductor memory device in accordance with a first embodiment of the present invention.

As shown, the circuit of the present invention includes an external power supply voltage detector 210, termination drivers 220 and 230, loading multiplexers 240 and 250, and a latch unit 260.

The external power supply voltage detector 210 detects a voltage level of an external power supply VDD terminal and outputs detected voltage levels as first and second voltage detection signals TS_A and TS_B. Here, the first and the second voltage detection signals TS_A and TS_B may have logic level values corresponding to the voltage level of the external power supply voltage VDD terminal. That is, when a voltage level of the external power supply voltage VDD terminal is higher than a specific voltage level (which will be referred as a 'reference voltage level,' hereinafter), the first voltage detection signal TS_A becomes logic 'high' and the second voltage detection signal TS_B also becomes logic 'high'. On the other hand, when a voltage level of the external power supply voltage VDD terminal is lower than the reference voltage level, the first voltage detection signal TS_A becomes logic 'low' and the second voltage detection signal TS_B also becomes logic 'high'. Lastly, when a voltage level of the external power supply voltage VDD terminal is equal to the reference voltage level, the first voltage detection signal TS_A becomes logic 'high' and the second voltage detection signal TS_B also becomes logic 'low'.

The termination drivers 220 and 230 receive the voltage of the external power supply voltage VDD terminal, drive a GIO line with a predetermined termination level, and include a first termination driver 220 and a second termination driver 230.

More specifically, the first termination driver 220 is coupled between the external power supply voltage VDD terminal and a first loading multiplexer 240. The first termination driver 220 includes a first PMOS transistor PM1 and a second PMOS transistor PM2 to generate a drive current in response to a termination enable signal EN_TERM. The first PMOS transistor PM1 has a source-drain path established between the external power supply voltage VDD terminal and a second PMOS transistor PM2, and a gate which receives a signal corresponding to the termination enable signal EN_TERM. The second PMOS transistor PM2 has a source-drain path established between the first PMOS transistor PM1 and the first loading multiplexer 240 and a gate which is coupled to a diode.

The second termination driver 230 is coupled between a second loading multiplexer 250 and a ground voltage VSS terminal. The second termination driver 230 includes a first NMOS transistor NM1 and a second NMOS transistor NM2 to generate a drive current in response to the terminal enable signal EN_TERM. The first NMOS transistor NM1 has a source-drain path established between a second NMOS transistor NM2 and the ground voltage VSS terminal and a gate which receives a signal corresponding to the termination enable signal EN_TERM. The second NMOS transistor NM2 has a source-drain path established between the second loading multiplexer 250 and the first NMOS transistor NM1 and a gate which is coupled to a diode.

Meanwhile, the loading multiplexers 240 and 250 selectively multiplex loading values of drive current paths of the termination drivers 220 and 230 in response to the voltage level of the external power supply voltage VDD terminal, and include a first loading multiplexer 240 and a second loading multiplexer 250.

The first loading multiplexer 240 includes first and second pull-up load multiplexers 242 and 244 to multiplex loads corresponding to the first and the second voltage detection signals TS_A and TS_B to the drive current generated from the first termination driver 220.

Here, the first pull-up load multiplexer 242 includes a first resistor R1 and a third PMOS transistor PM3. The first resistor R1 is connected between the first termination driver 220 and the second pull-up load multiplexer 244. The third PMOS transistor PM3 has a source-drain path connected between both ends of the first resistor R1 and a gate which receives the first voltage detection signal TS_A. The second pull-up load multiplexer 244 includes second and third resistors R2 and R3 and a fourth PMOS transistor PM4. The second and third resistors R2 and R3 are coupled in parallel between the first pull-up load multiplexer 242 and the GIO line. The fourth PMOS transistor PM4 has a source-drain path connected between both ends of the second resistor R2 and a gate receives the second voltage detection signal TS_B.

The first resistor R1, the second resistor R2 and the third resistor R3 may have the same load value. That is, the load of the first resistor R1 and the load of the second and the third resistors R2 and R3 coupled in parallel may have different loads. As a result, any such loads are applied to the third and the fourth PMOS transistors PM3 and PM4 in response to the first and the second voltage detection signals TS_A and TS_B, and may be provided to a corresponding drive current path.

Here, the first to third resistors R1, R2 and R3 as a load unit and the third and the fourth PMOS transistors PM3 and PM4 as a selection unit may be configured differently depending on designs. In other words, the load unit may be designed in series or in parallel and the selection unit may be designed in various ways corresponding to the design of the load unit. In particular, for a parallel configuration, a plurality of MOS transistors having different sizes may be provided to perform the roles of both the load unit and the selection unit. In this case, the plurality of MOS transistors may have different load values when each of them is turned on. In addition, the number of the first and the second detection signals TS_A and TS_B applied to the selection unit may be also set differently depending on how the external power supply voltage detector 210 is designed.

As a result, the first and the second load multiplexers 242 and 244 in accordance with an embodiment of the present invention may reflect different loads on a drive current path corresponding to the first termination driver 220 in response to the first and the second voltage detection signals TS_A and TS_B.

The second load multiplexer 250 includes first and second pull-down load multiplexers 252 and 254 to multiplex a load corresponding to the first and the second voltage detection signals TS_A and TS_B on the drive current generated from the second termination driver 230.

Here, the first pull-down load multiplexer 252 includes a fourth resistor R4 and a third NMOS transistor NM3. The fourth resistor R4 is connected between the second pull-down load multiplexer 254 and the second termination driver 230. The third NMOS transistor NM3 has a source-drain path connected between both ends of the fourth resistor R4 and a gate which receives an inverted signal of the first voltage detection signal TS_A. The second pull-down load multiplexer 254 includes fifth and sixth resistors R5 and R6 and a fourth NMOS transistor NM4. The fifth and sixth resistors R5 and R6 are coupled in parallel between the GIO line and the first pull-down load multiplexer 252. The fourth NMOS transistor NM4 has a source-drain path connected between both ends of the fifth resistor R5 and a gate which receives an inverted signal of the second voltage detection signal TS_B.

Thus, the first and the second pull-down load multiplexers 252 and 254 multiplex different loading values on a driving current path corresponding to the second termination driver 230 in response to the first and the second voltage detection signals TS_A and TS_B.

Figure 1:
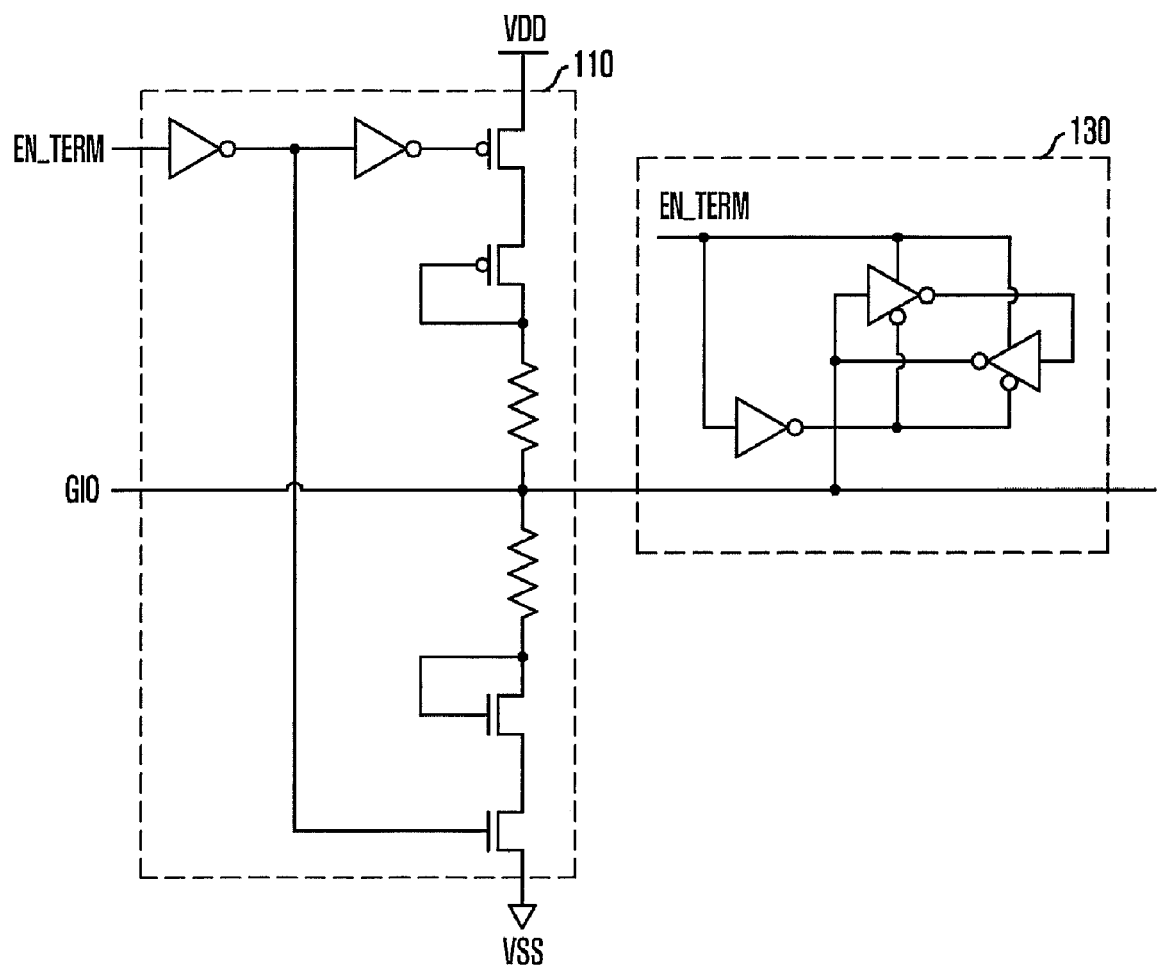
FIG. 1 is a circuit diagram illustrating a partial configuration of a conventional semiconductor memory device.

Meanwhile, the latch unit 260 latches data applied to the GIO line in response to the termination enable signal EN_TERM, and has a configuration same with the configuration shown in FIG. 1 for illustrating the same latching operation.

Here, the termination enable signal EN_TERM is activated to a logic 'low' during a read operation of the semiconductor memory device and is inactivated to logic 'high' during a write operation thereof. That is, during the read operation, the first and the second termination drivers 220 and 230 perform a termination operation on the GIO line, while the latch unit 260 latches the data applied to the GIO line during the write operation.

Herein, first and second inverter INV1 and INV2 adjust a logic level of the termination enable signal EN_TERM to control the termination operation of the first and the second termination drivers 220 and 230. Similarly, third and fourth inverter INV3 and INV4 adjust logic levels of the first and the second voltage detection signals TS_A and TS_B to control the selection operation of the first and the second loading multiplexers 240 and 250.

Hereafter, a termination operation of the termination circuit in accordance with the first embodiment of the present invention will be described in detail. For illustration purposes, it may be assumed that the first to third resistors R1, R2 and R3 all have the same load. Here, examples of a load that may be obtained by a combination of the first to third resistors R1, R2 and R3 may be as follows. Firstly, the drive current path may have a load 'reference load' corresponding to the first resistor R1. Secondly, the drive current path may have a larger load than the reference load where, for example, all of the first to third resistors R1, R2 and R3 are included therein. Thirdly, the drive current path may have a less load than the reference load where the driver current path includes the second and the third resistors R2 and R3 coupled in parallel.

During the read operation, when the termination operation of the first termination driver 220 is performed, the GIO line is pre-charged to a termination level (e.g., a ½ voltage level of the external power supply voltage), and data applied to the GIO line is transferred with a voltage swing during the termination operation.

At this time, in a first case that a voltage level of the external power supply voltage VDD terminal corresponds to the reference voltage level, the first resistor R1 is included in the drive current path in response to the first and the second voltage detection signals TS_A and TS_B. Thus, a drive current which has the reference load flows into the GIO line.

In a second case that a voltage level of the external power supply voltage VDD terminal is higher than the reference voltage level, the first termination driver 220 generates a larger amount of drive current than that of the first case. At this time, all of the first to third resistors R1, R2 and R3 are included in the drive current path in response to the first and the second voltage detection signals TS_A and TS_B. Thus, a drive current, which has a load larger than the reference load, flows into the GIO line.

In a third case that a voltage level of the external power supply voltage VDD terminal is lower than the reference voltage level, the first termination driver 220 generates a smaller amount of drive current than that of the first case. At this time, only the second and the third resistors R2 and R3 coupled in parallel are included in the drive current path in response to the first and the second voltage detection signals TS_A and TS_B. Thus, a drive current, which has a load smaller than the reference loading value, flows into the GIO line.

Consequently, in the semiconductor memory device in accordance with an embodiment of the present invention, the same drive current flows into the GIO line in all of the first, second and third cases. This operation is also applied similarly to the second termination driver 230 and the second load multiplexer 250, and therefore, a description thereon will be omitted here.

Figure 3:
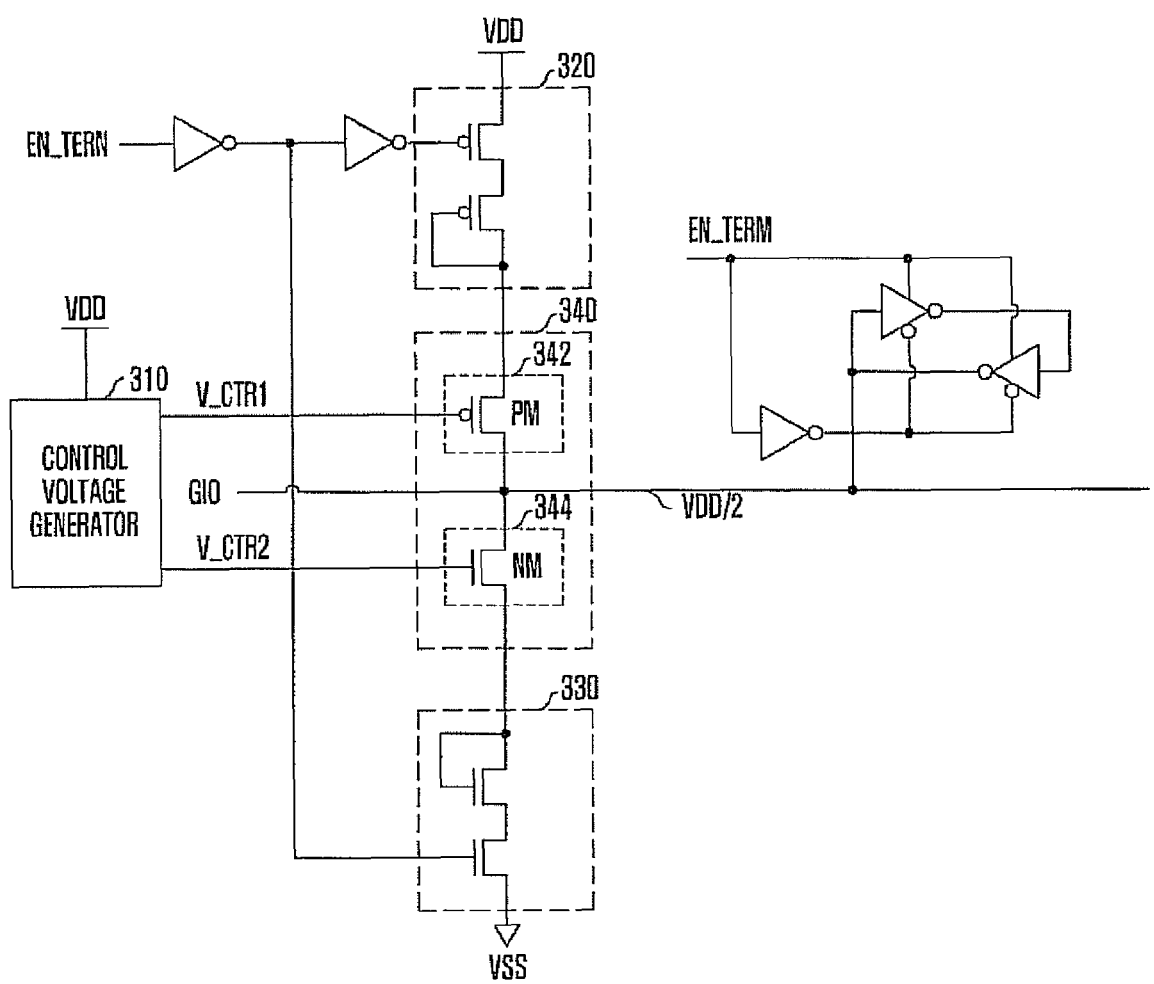
FIG. 3 is a circuit diagram illustrating a termination operation of a semiconductor memory device in accordance with a second embodiment of the present invention.

FIG. 3 is a circuit diagram illustrating a termination operation of a semiconductor memory device in accordance with a second embodiment of the present invention. For illustration purposes, a description will be made only for different elements from those of the first embodiment shown in FIG. 2.

As shown, the circuit in accordance with the second embodiment of the present invention includes a control voltage generator 310, first and second termination drivers 320 and 330, and a drive current controller 340.

The control voltage generator 310 generates first and second current control signals V_CTR1 and V_CTR2 corresponding to a voltage level of an external power supply voltage VDD terminal. That is, the first current control signal V_CTR1 has a higher voltage level as a voltage level of the external power supply voltage VDD terminal becomes higher, or has a lower voltage level as a voltage level of the external power supply voltage VDD terminal becomes lower. On the other hand, the second current control signal V_CTR2 has a lower voltage level as a voltage level of the external power supply voltage VDD terminal becomes higher, or has a higher voltage level as a voltage level of the external power supply voltage VDD terminal becomes lower.

The drive current controller 340 includes a pull-up current controller 342 and a pull-down drive current controller 344 and controls the drive current flowing from the first and the second termination drivers 320 and 330 into the GIO line in response to the first and the second current control signals V_CTR1 and V_CTR2.

The pull-up drive current controller 342 controls a drive current generated from the first termination driver 320 in response to the first current control signal V_CTR1, and includes a PMOS transistor PM. The PMOS transistor PM has a source-drain path established between the first termination driver 320 and the GIO line and a gate which receives the first current control signal V_CTR1. Thus, the pull-up drive current controller 342 drives the GIO line with the drive current controlled by the first current control signal V_CTR1.

The pull-down drive current controller 344 controls a drive current generated from the second termination driver 330 in response to the second current control signal V_CTR2, and includes an NMOS transistor NM. The NMOS transistor NM has a source-drain path established between the GIO line and the second termination driver 330 and a gate which receives the second current control signal V_CTR2. Thus, the pull-down drive current controller 344 drives the GIO line with the drive current controlled by the second current control signal V_CTR2.

Here, the PMOS transistor PM and the NMOS transistor NM may be designed in the same size. When a voltage level of the external power supply voltage VDD terminal becomes higher, their loads become larger. On the other hand, when a voltage level of the external power supply voltage VDD terminal becomes lower, their loads become smaller.

Hereafter, a termination operation of the termination circuit in accordance with the second embodiment of the present invention will be described in detail.

During the read operation, when the first and the second termination drivers 320 and 330 perform a termination operation, the GIO line is pre-charged to a termination level and data applied to the GIO line is transferred with a voltage swing during the termination operation.

At this time, in a first case that a voltage level of the external power supply voltage VDD terminal corresponds to the reference voltage level, the drive current controller 340 may apply a drive current 'reference drive current' that corresponds to the first and the second current control signals V_CTR1 and V_CTR2 to the GIO line.

In a second case that a voltage level of the external power supply voltage VDD terminal is higher than the reference voltage level, the termination drivers 320 and 330 generate a larger amount of drive current than that of the first case. At this time, the drive current controller 340 controls the drive current generated from the termination drivers 320 and 330 in response to the first and the second current control signals V_CTR1 and V_CTR2 and then apply this to the GIO line. In this case, the drive current applied may have the same value as the reference drive current.

In a third case that a voltage level of the external power supply voltage VDD terminal is lower than the reference voltage level, the termination drivers 320 and 330 generate a smaller amount of drive current than that of the first case. At this time, the drive current controller 340 controls the drive current generated from the termination drivers 320 and 330 in response to the first and the second current control signals V_CTR1 and V_CTR2 and then apply this to the GIO line. In this case, the drive current applied may have the same value as the reference drive current.

As a result, although there is a voltage level variation of the external power supply voltage VDD terminal, the semiconductor memory device in accordance with an embodiment of the present invention may apply a constant referent drive current to the GIO line. That is, the reference drive current can be constantly kept, regardless of a voltage level of the external power supply voltage VDD terminal.

In accordance with the first and the second embodiments of the present invention, although there is a voltage level variation of the external power supply voltage VDD terminal, they may apply a constant or stable referent drive current to the GIO line. This indicates that the transfer speed of data may be kept constant, thereby preventing a margin failure between data transferred through the GIO line and a receiver (not shown), which is connected to the GIO line and receives the data. That is, it is possible to secure a sufficient margin (e.g., a time span allowed for data transfer) between the data transferred and a specific time of the receiver. In addition, a stable data transfer speed may minimize coupling that was generated between adjacent GIO lines depending on a voltage level of the external power supply voltage VDD terminal.

It should be noted that the logic gates and transistors used in the embodiments set forth above may be arranged at different positions and implemented in different types based on the polarity of input signals.

As described above, the present invention can keep a constant drive current flowing into a GIO line depending on a voltage level of an external power supply voltage to minimize coupling between adjacent GIO lines, thereby preventing a malfunctioning due to the occurrence of such coupling.

In addition, the present invention may obtain a sufficient margin when data transferred through a GIO line is received by a receiver, and thus secure the stability and reliability of data.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a termination driver configured to drive a data line with a predetermined termination voltage level by using an external power supply voltage;
    a control voltage generator configured to generate a first control voltage and a second control voltage corresponding to a voltage level of the external power supply voltage: and
    a drive current controller configured to control a drive current flowing into the data line from the termination driver in response to the first and second control voltages corresponding to the voltage level of the external power supply voltage,
    wherein the first control voltage has a higher voltage level as a voltage level of the external power supply voltage becomes higher, and the second control voltage has a lower voltage level as the voltage level of the external power supply voltage becomes higher.

2. The semiconductor device as recited in claim 1, wherein the drive current controller is configured to drive the data line with the drive current corresponding to the control voltage.

3. The semiconductor device as recited in claim 1, further comprising a latch unit configured to latch data applied to the data line in response to an enable signal.

4. The semiconductor device as recited in claim 3, wherein the enable signal has a logic level corresponding to read and write commands.

5. The semiconductor device as recited in claim 3, wherein the termination driver includes:
   a first driver, coupled between a terminal of the external power supply voltage and the data line, configured to generate a first drive current in response to the enable signal; and
   a second driver, coupled between the data line and a ground voltage terminal, configured to generate a second drive current in response to the enable signal.

6. The semiconductor device as recited in claim 5, wherein the drive current controller includes:
   a first current controller, coupled between the first driver and the data line, configured to control the first drive current in response to the first control voltage to apply the first drive current to the data line; and
   a second current controller, coupled between the second driver and the data line, configured to control the second drive current in response to the second control voltage to apply the second drive current to the data line.

7. The semiconductor device as recited in claim 6, wherein, when the voltage level of the external power supply voltage is higher or lower than a predetermined voltage level, each of the first and the second current controllers is configured to control a drive current generated from the termination driver to apply a drive current corresponding to the predetermined voltage level to the data line.

8. The semiconductor device as recited in claim 1, wherein the predetermined termination voltage level is a half of the external power supply voltage.

\* \* \* \* \*